(12) United States Patent
Rinerson et al.

(10) Patent No.: US 7,038,935 B2
(45) Date of Patent: May 2, 2006

(54) 2-TERMINAL TRAPPED CHARGE MEMORY DEVICE WITH VOLTAGE SWITCHABLE MULTI-LEVEL RESISTANCE

(75) Inventors: Darrell Rinerson, Cupertino, CA (US); Wayne Kinney, Emmett, ID (US); Steven W. Longcor, Mountain View, CA (US); Edmond R. Ward, Mount Sereno, CA (US); Steve Kuo-Ren Hsia, San Jose, CA (US); Christophe J. Chevallier, Palo Alto, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 10/634,636

(22) Filed: Aug. 4, 2003

(65) Prior Publication Data

US 2004/0160812 A1    Aug. 19, 2004

Related U.S. Application Data

(63) Continuation-in-part of application No. 10/249,846, filed on May 12, 2003, now Pat. No. 6,859,382.

(60) Provisional application No. 60/422,922, filed on Oct. 31, 2002, provisional application No. 60/400,849, filed on Aug. 2, 2002.

(51) Int. Cl.
*G11C 11/00* (2006.01)
*H01L 29/02* (2006.01)

(52) U.S. Cl. ............... 365/148; 365/100; 365/163; 257/2; 257/5; 257/52

(58) Field of Classification Search ........... 365/100, 365/148, 163; 257/2, 3, 5

See application file for complete search history.

(56) References Cited

U.S. PATENT DOCUMENTS

| 3,571,673 A | * | 3/1971 | Ovshinsky et al. ............ 257/2 |
| 6,204,139 B1 | | 3/2001 | Liu et al. .................... 438/385 |
| 6,657,888 B1 | * | 12/2003 | Doudin et al. ............. 365/158 |
| 6,809,955 B1 | * | 10/2004 | Bulovic et al. ............. 365/151 |
| 6,813,176 B1 | * | 11/2004 | Gilton et al. ............... 365/100 |

OTHER PUBLICATIONS

Basun, S. A. et al., "Photoinduced Phenomena in $Sr_{1-x}CA_xTiO_2$, $0 \leq x \leq 0.12$", Ferroelectrics, vol. 183, 1996,255-264.

Baiatu, T. et al., "dc Electrical Degradation of Peroskite-Type Titanates: III, A Model of the Mechanism", J. Am. Ceram. Soc., vol. 73, No. 6, 1990,1663-73.

(Continued)

*Primary Examiner*—Son Mai

(57) ABSTRACT

A 2-terminal trapped charge memory device is disclosed with voltage switchable multi-level resistance. The trapped charge memory device has a trapped charge memory body sandwiched between two electrodes. The trapped charge memory body can be made of a variety of semiconducting or insulating materials of single-crystalline, poly-crystalline or amorphous structure while containing current carrier traps whose respective energy levels and degrees of carrier occupancy, modifiable by the height and width of an applied write voltage pulse, determine the resistance. The mechanism of modification can be through carrier tunneling, free carrier capturing, trap-hopping conduction or Frenkel-Poole conduction. The current carrier traps can be created with dopant varieties or an initialization procedure.

46 Claims, 10 Drawing Sheets

OTHER PUBLICATIONS

Beck, A. et al., "*Reproducible switching effect in thin oxide films for memory applications*", Applied Physics Letters, vol. 77, No. 1, Jul. 3, 2000,139-141.

Koidl, P. et al., "*Photochromism in Ni-doped $SrTiO_3$*," Physical Review B, vol. 14, No. 7, Oct. 1, 1976, 2703-2708.

Millis, A. J., "*Lattice Effects in Magnetoresistive Manganese Perovskites*," Nature, vol. 392, Mar. 12, 1998, 147-150.

Rossel, C. et al., "*Electrical current distribution across a metal-insulator-metal structure during bistable switching*," Journal of Applied Physics, vol. 90, No. 6, Sep. 15, 2001, 2892-2898.

Simmons, J. G., "*New Conduction and Reversible Memory Phenomena in thin insulating films,*"Proc. Roy. Soc. A., 301, 77-102, 1967.

Sze, S.M., "*Physics of Semiconductor Devices*," Bell Laboratories Inc., Murray Hill, NJ, © 1981 John Wiley & Sons, Inc., ISBN 0-471-05661-8.

Waser, R., et al., "*dc Electrical Degradation of Peroskite-Type Titanates:I, Ceramics*", J. Am. Ceram. Soc., vol. 73, No. 6, 1990,1645-53.

Waser, R., et al., "*dc Electrical Degradation of Peroskite-Type Titanates:II, Single Crystals*", J. Am. Ceram. Soc., vol. 73, No. 6, 1990,1654-62.

Waser, R., et al., " *Bulk Conductivity and Defect Chemistry of Acceptor-Doped Strontium Titanate in the Quenched State*", J. Am. Ceram. Soc., vol. 74, No. 8, 1991,1934-40.

Watanabe, Y. et al., "*Current-driven insulator-conductor transition and nonvolatile memory in chromium-doped $SrTiO_3$ single crystals*", Applied Physics Letters, vol. 78, No. 23, Jun. 4, 2001, 3738-3740.

Zimmermann, M. V., et al, "*X-Ray Resonant Scattering Studies of Orbital and Charge Ordering in $Pr_{1-x}Ca_xMnO_3$*," Physical Review B., vol. 64, 195133, 1-17.

* cited by examiner

2-TERMINAL TRAPPED CHARGE MEMORY DEVICE WITH VOLTAGE SWITCHABLE MULTI-LEVEL RESISTANCE

CROSS REFERENCE TO RELATED APPLICATIONS

This application is a continuation-in-part of U.S. patent application Ser. No. 10/249,846, filed May 12, 2003, now U.S. Pat. No. 6,859,382 which claims the benefit of U.S. Provisional Application No. 60/400,849, filed Aug. 2, 2002, and U.S. Provisional Application No. 60/422,922, filed Oct. 31, 2002, all of which are incorporated herein by reference in their entireties and for all purposes. This application is related to the following U.S. patent applications: application Ser. No. 10/360,005, filed Feb. 7, 2003 now Pat. No. 6,753,539; application Ser. No. 10/330,512, filed Dec. 26, 2002 now Pat. No. 6,753,561; application Ser. No. 10/330,153, filed Dec. 26, 2002 now Pat. No. 6,834,008; application Ser. No. 10/330,964, filed Dec. 26, 2002 now Pat. No. 6,831,854; application Ser. No. 10/330,170, filed Dec. 26, 2002 now Pat. No. 6,970,375; application Ser. No. 10/330,900, filed Dec. 26, 2002 now Pat. No. 6,850,429; application Ser. No. 10/330,150, filed Dec. 26, 2002 now Pat. No. 6,798,685; application Ser. No. 10/330,965, filed Dec. 26, 2002 now Pat. No. 6,850,455; application Ser. No. 10/249,848, filed May 12, 2003 now Pat. No. 6,856,536; application Ser. No. 10/612,733, filed Jul. 1, 2003; application Ser. No. 10/613,099, filed Jul. 1, 2003 now Pat. No. 6,836,421; application Ser. No. 10/612,191, filed Jul. 1, 2003 now Pat. No. 6,906,191; application Ser. No. 10/612,263, filed Jul. 1, 2003; and application Ser. No. 10/612,776, filed Jul. 1, 2003. All of the above applications are hereby incorporated herein by reference in their entireties and for all purposes.

FIELD OF THE INVENTION

This invention concerns the general field of memory devices. Specifically, the present invention is directed to two terminal memory devices.

BACKGROUND OF THE INVENTION

The use of stored or trapped charges is the dominant mechanism for storing data in a non-volatile memory cell. The charges of the memory cell are trapped or stored at various internal structures, such as: (a) floating gates; (b) material interfaces between, for example, a nitride and an oxide (SONOS cells); and (c) regions within an insulator that contain islands of conductive materials such as silicon rich oxides.

During device operation, these trapped charges function to modify, for example, the silicon surface conductivity of a FET. A corresponding general device configuration is illustrated in FIG. 1. A FET 100 includes a source 130 and a drain 120 separated by a control gate 110. This FET 100 can be of n-type or p-type. For simplicity we will describe an n-type FET. Thus, the drain 120 and the source 130 are both made of an n-doped semiconductor material while the substrate 140 is made of a p-doped semiconductor material. When a positive voltage is applied to the control gate 110, electrons within the substrate 140 are attracted toward the control gate 110 and form an inversion layer 150 in an area called the 'channel' that is within the substrate 140 and under the control gate 110. The channel then allows current conduction between the drain 120 and the source 130.

Notwithstanding the foregoing description, the presence of any trapped charges 160 within the oxide 170 and between the control gate 110 and the substrate 140 will modify the required value of the voltage applied to the control gate 110 to create the inversion layer 150. For a case of negative trapped charges 160, the higher the magnitude of trapped charge the higher the required voltage would have to be. The reason is that the negative charges trapped in the oxide will repel the electrons away from the channel, necessitating the application of a higher positive voltage on the control gate 110 to counteract this effect.

For each of the above devices, the magnitude of trapped charges can be altered through various mechanisms. Retrieving data can then be accomplished by sensing the voltage that is required to create the inversion layer.

SUMMARY OF THE INVENTION

The present invention discloses a 2-terminal trapped charge memory device with a voltage switchable multi-level resistance $R_d$. In addition to a top electrode and a bottom electrode, the trapped charge memory device includes a trapped charge memory body sandwiched between the top electrode and the bottom electrode. The trapped charge memory body includes current carrier traps with at least one of whose energy levels, respective degrees of carrier occupancy and concentration determine the $R_d$. The respective degrees of carrier occupancy of the current carrier traps are modifiable by the height and width of an applied write voltage pulse resulting in a desired switching behavior of the multi-level resistance $R_d$. The mechanism of modification of carrier occupancy can be any of carrier tunneling, free carrier capturing, trap-hopping conduction and Frenkel-Poole conduction. The range of achievable resistance switching time can be made from about 0.1 ns to about 100 μs. Additionally, one or both of the top electrode-to-memory body contact and the bottom electrode-to-memory body contact can be made non-ohmic to create a corresponding nonlinearity of $R_d$.

A variety of material, fabrication and design parameters are identified affecting the electrical terminal behavior of the 2-terminal trapped charge memory device. The trapped charge memory body can be made of an insulator, a conductor, a conductive oxide, a polymer, organic molecules, carbon nanotubes or a semiconductor with a layer thickness between about 100 Å and about 5000 Å. The trapped charge memory body structure can be single-crystalline, poly-crystalline or amorphous. The current carrier traps and their degree of occupancy can be created with the addition of dopant varieties or with an initialization procedure during or after the fabrication of the memory device. The initialization procedure can be high energy radiation or particle beam bombardment.

BRIEF DESCRIPTION OF DRAWINGS

The current invention will be better understood and the summary of the invention set forth above will become apparent when consideration is given to the following detailed description of the preferred embodiments. For clarity of explanation, the detailed description further makes reference to the attached drawings herein.

GLOSSARY

Figure 1:
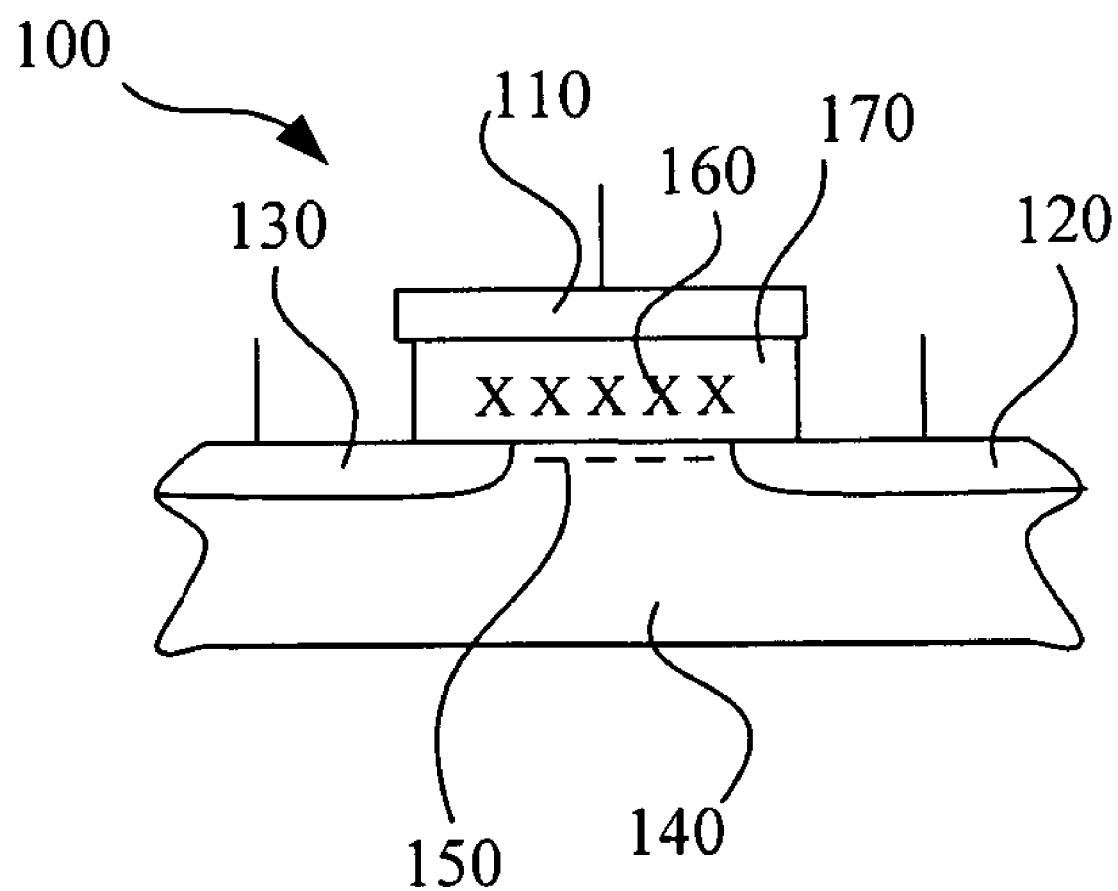
FIG. 1 depicts a cross-section of a prior art memory device.

As used in the present specification, the following words and phrases are generally intended to have the meanings as set forth below, except to the extent that the context in which they are used indicates otherwise. The following abbreviations and terms have the indicated meanings throughout:

The term "array" refers to a plurality of objects arranged in a regular pattern.

The term "CMO" refers to a conductive metal oxide.

The term "conductive line" refers to an interconnect line connecting elements of an integrated circuit ("IC").

The term "cross point memory array" refers to an array with two sets of generally perpendicular lines with memory cells placed at the intersections between the sets of lines.

The term "current carrier" refers to charged particles within a conductive or semiconductive material capable of carrying an electrical current, typically a negatively charged electron or a positively charged hole.

The term "electrode" refers to a low resistivity object through which an electrical current or voltage is brought to another object in contact with the electrode.

The term "FET" refers to a field effect transistor.

The term "IC" refers to an integrated circuit.

The term "layer" refers to a coating with a certain thickness. Within an IC, a layer is generally located in a plane parallel to the IC substrate.

The term "Memory Cell" refers to a basic functional structure, usually consisting of a set of devices to store a unit of information, for example one bit.

The term "Memory Material" refers to a material that is capable of storing information.

The term "Memory Plug" refers to various layers of materials arranged between conductive lines and including at least a memory material and typically including a top electrode and a bottom electrode.

The term "MOCVD" refers to a metalorganic chemical vapor deposition.

The term "PLD" refers to a pulsed laser deposition.

The term "SONOS cells" refers to a silicon oxide nitride oxide silicon structure—a non-volatile memory technology.

The term "STO" refers to strontium titanate.

The term "SZO" refers to strontium zirconate.

The term "Thin Film" refers to a film of thickness generally less than 10 μm.

The term "UV" refers to ultra violet.

DETAILED DESCRIPTION OF THE PREFERRED EMBODIMENTS

In the following description, numerous specific details are set forth in order to provide a thorough understanding of the present invention. However, it will become obvious to those skilled in the art that the present invention may be practiced without these specific details. In other instances, well-known methods, procedures, materials, components and circuitry have not been described in detail to avoid unnecessary obscuring aspects of the present invention. The detailed description is presented largely in terms of simplified semiconductor device cross sections, bulk and interface energy band diagrams and associated electrical terminal I-V characteristics. These descriptions and representations are the means used by those experienced or skilled in the art to concisely and most effectively convey the substance of their work to others skilled in the art.

Figure 2:
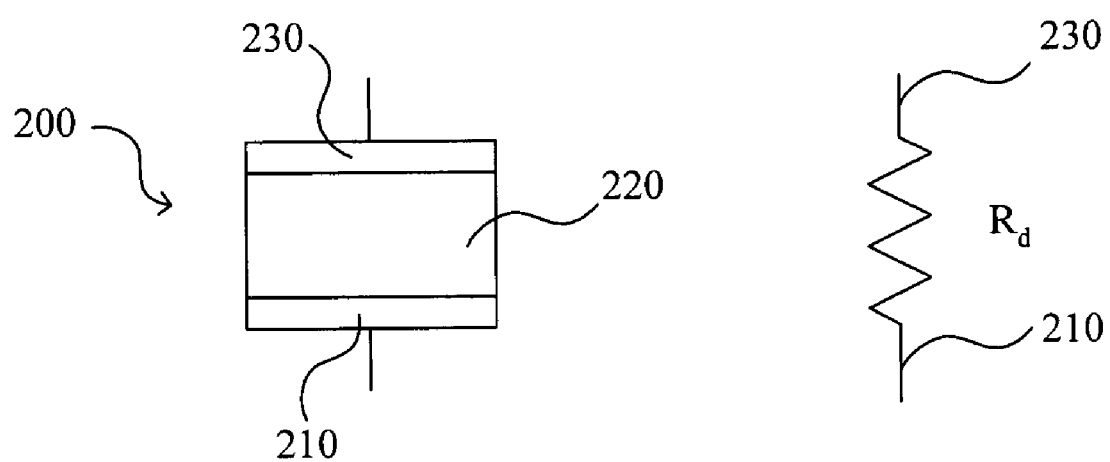
FIG. 2 depicts a cross-section and a schematic diagram of the trapped charge memory device according to the present invention.

FIG. 2 illustrates a cross-section of a trapped charge memory device according to the present invention. The trapped charge memory device 200 comprises a bottom electrode 210, a trapped charge memory body 220 and a top electrode 230. The trapped charge memory device has a resistance of $R_d$ between the bottom electrode 210 and the top electrode 230. Generally, both the top and the bottom electrodes are made of a highly conductive material. The trapped charge memory body 220 is generally made of a material having the following characteristics: (a) it is a conductive metal oxide; (b) it has a microscopic structure that is single crystalline or poly-crystalline (collectively "crystalline") or amorphous; (c) it is between 100 Å and 5000 Å in thickness; and (d) it has been modified to have numerous locations of current carrier traps introduced therein.

In the above, a current carrier can be either a negatively charged electron or a positively charged hole. The current carrier trap locations, or simply traps, are regions within the trapped charge memory body 220 material causing the presence of localized energy levels within the bandgap of the trapped charge memory body material. These traps are thus capable of trapping, or immobilizing, current carriers within the trapped charge memory body material and affecting its resistance $R_d$.

Furthermore, the degree of charging or discharging the traps are dependent upon localized energy levels within the bandgap. Also, the carrier occupancy can be affected by an electric field applied across the trapped charge memory body 220 and accompanied by a corresponding current flow. Typically, the electric field will need to be beyond a certain threshold value before it affects carrier occupancy. Consequently, the resistance $R_d$ of a properly designed trapped charge memory device 200 can be switched through multiple values following a corresponding number of applied voltage thresholds. The means of creating and configuring these traps will be presently described.

For a crystalline trapped charge memory body 220 material, the traps may be located within the crystal lattice. However, for a poly-crystalline trapped charge memory body 220 material, the traps may be located within the grain boundaries or within a molecular structure.

To foster the creation of traps, extrinsic materials, called dopants, can be introduced into the trapped charge memory body 220 in minute quantities. Typically, the dopant would make up less than 10% molecular percentage of the total material. As a result, some dopants create trapping centers at deep energy levels within the bandgap. That is, once captured at these trapping centers, a current carrier would need to acquire a sufficient amount of energy to regain its mobility. For example, the elements Cr, Fe or Ni can create traps at deep energy levels in STO and in SZO. On the other hand, the elements Y, La, Nb and Ta primarily create centers at shallow energy levels which typically do not act as traps. See the technical papers "Photochromism in Ni-doped $SrTiO_3$," P. Koidl et al, Physical review B, Vol. 14, No. 7, Oct. 7, 1976 PP. 2703–2708, and "Photoinduced Phenomina in $Sr_{1-x}Ca_{x^-}TiO_2$, $0<=x<=0,12$," S. A. Basun et al, Ferroelectrics, 1996, Vol. 183, PP. 255–264, both incorporated herein by reference and for all purposes.

Traps can also be introduced in the trapped charge memory body with high energy radiation or particle beam bombardment. For example, UV and X-ray radiation induces traps in $SiO_2$. Also, neutron transmutation doping has been used to create dopant atoms in silicon.

Traps can also be created intrinsically within the trapped charge memory body 220 material during its fabrication. Examples of such mechanisms have been described in U.S. patent application Ser. No. 10/330,512, filed Dec. 26, 2002, already incorporated herein by reference. Furthermore, traps can be created by an electrical initialization process during which oxygen vacancies drift through a complex metal oxide in the presence of an applied electric field. See references "DC Electrical Degradation of Perovskite-Type Titanates (Ceramics, Single Crystal, A Model of the Mechanism): I, II & III," Rainer Waser et al, J. Am. Ceram. Soc., 73 [6] 1990 PP. 1645–1663 and "New conduction and reversible memory phenomena in thin insulating films" J. G. Simmons and R. R. Verderber, Proc. Roy. Soc. A. 301, 1967 PP. 77–102, both incorporated herein by reference and for all purposes.

Figure 3A:
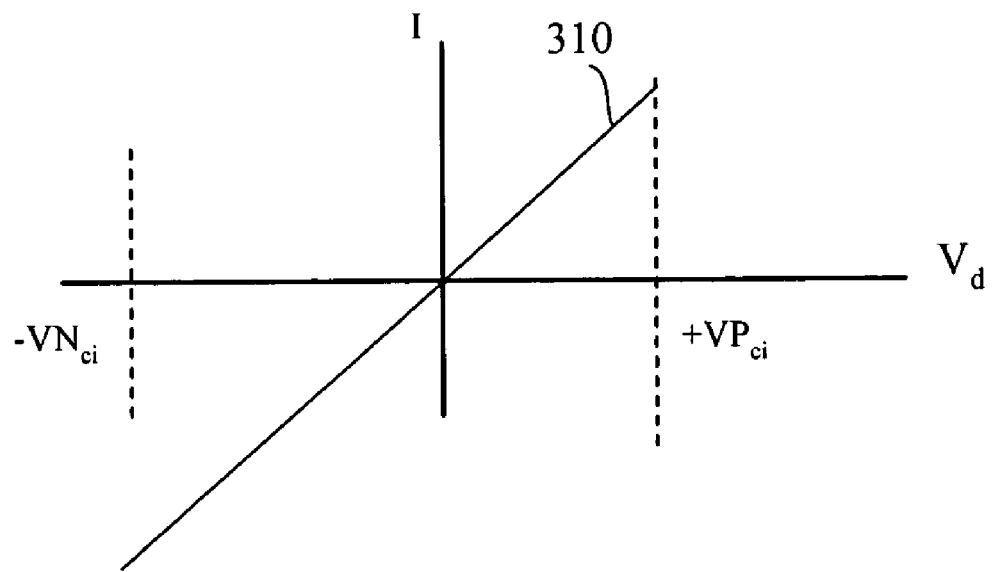
FIG. 3A depicts a current vs. voltage characteristics of the trapped charge memory device with its resistance in a first state.
Figure 3B:
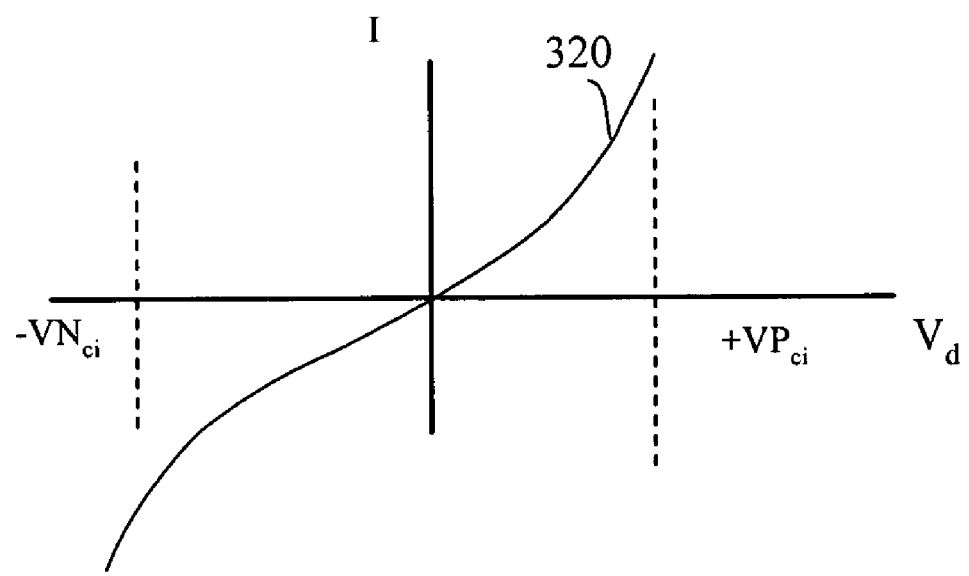
FIG. 3B depicts another current vs. voltage characteristics of the trapped charge memory device with its resistance still in a first state while exhibiting a degree of nonlinearity.
Figure 4:
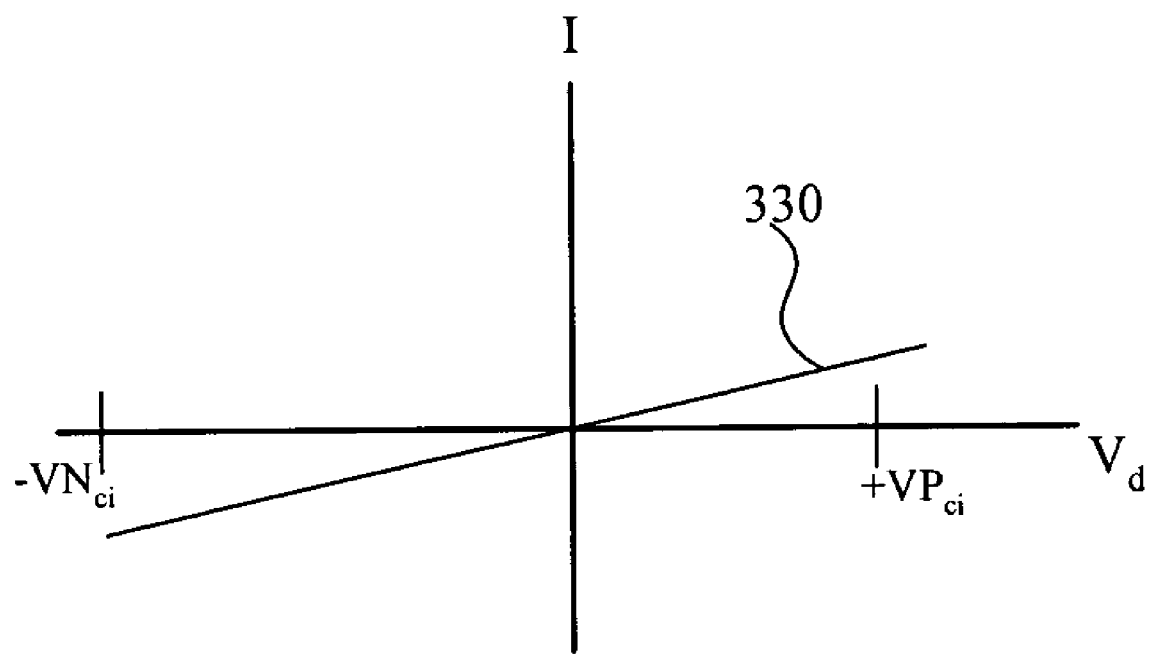
FIG. 4 depicts a current vs. voltage characteristics of the trapped charge memory device with its resistance in a second state.

An example of a trapped charge memory device whose resistance $R_d$ can be switched through two distinct values is illustrated in FIG. 3A, FIG. 3B and FIG. 4. FIG. 3A depicts a current vs. voltage characteristics of the trapped charge memory device with its resistance in a first state. When a voltage $V_d$ is applied across the trapped charge memory device 200, a current flow I occurs. As long as the voltage $V_d$ stays within the following critical values:

$$-VN_{c1}<=V_d<=+VP_{c1} \quad (1)$$

the I-V line 310 are generally ohmic, or linear. The values $-VN_{c1}$ and $+VP_{c1}$ represent voltage thresholds at which the trapped charge memory body 220 can change the magnitude of the trapped current carriers. However, it should be appreciated that there exists saturation points where either no more or no less current carriers can be trapped. If the trapped charge memory body 220 is in one of these saturation points, then $V_d$ can be placed beyond the voltage threshold and still maintain a constant $R_d$. In FIG. 3A, the slope of the I-V line 310 defines a first resistance value of $R_1$ such that $R_d=R_1$.

For certain applications, either one or both of the top electrode to trapped charge memory body contact and the bottom electrode to trapped charge memory body contact can be made non-ohmic with the $R_d$ exhibiting a corresponding degree of nonlinearity and this is illustrated as I-V curve 320 in FIG. 3B.

When the trapped charge memory body 220 is in its first resistive state and a voltage greater than $+VP_{c1}$ is maintained across the trapped charge memory device for a certain length of time, called the resistance switching time, $R_d$ will change to a second state of generally a higher resistance value $R_2$, that is the slope of the I-V line 330 in FIG. 4. In practice, a resistance switching time in the range of from about 0.1 ns to about 100 μs has been achieved.

Figure 5:
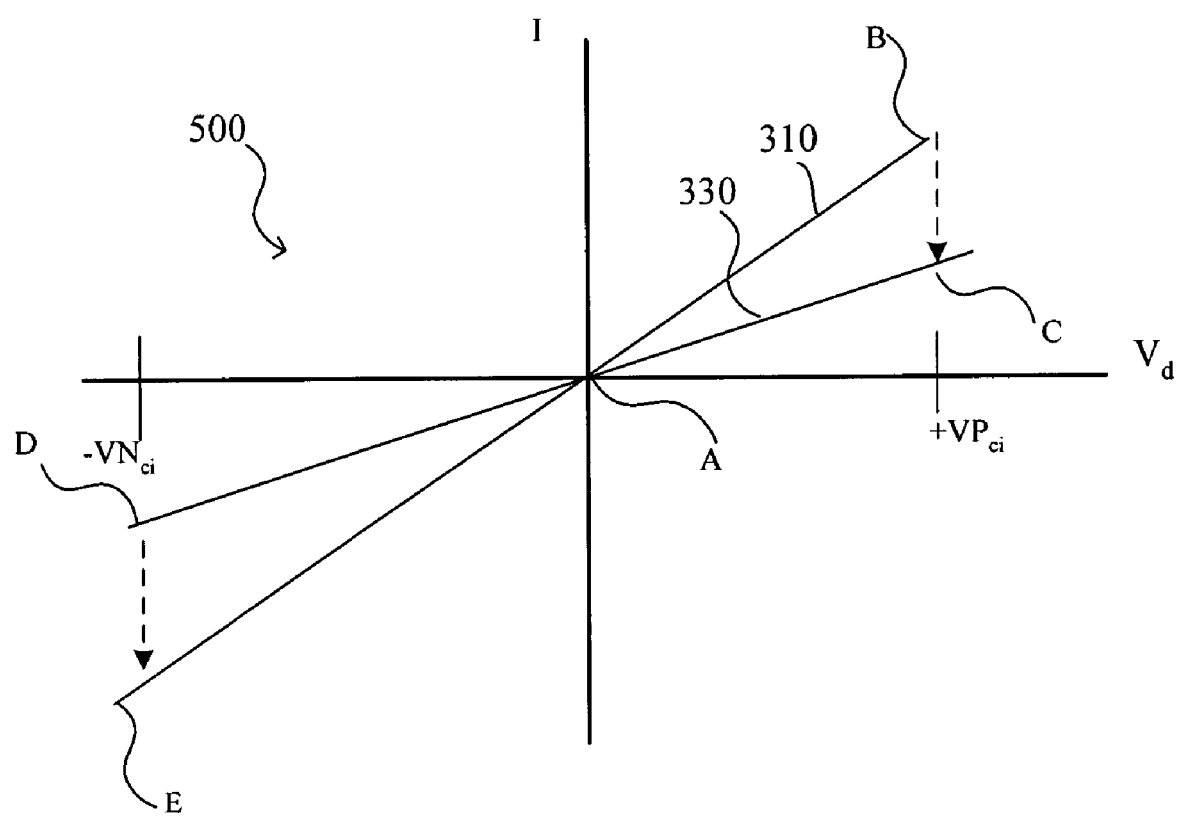
FIG. 5 depicts a composite current vs. voltage characteristics of the trapped charge memory device with both of its resistance states superimposed.

FIG. 5 depicts a composite I-V curve 500 of the trapped charge memory device with both of its resistance states superimposed. Starting with Point A of $V_d=0$ thus I=0, within the region between Point A and Point B and characterized by:

$$0<=V_d<=+VP_{c1} \quad (2)$$

the current I flows through the trapped charge memory body 220 wherein the traps are not filled with current carriers. However, once a critical electric field strength is exceeded within the trapped charge memory body 220 the traps are subsequently filled with current carriers and the presence of the trapped charge changes the current flow to a generally lower value. This is indicated by Point C with a dashed pointing arrow. Now if $V_d$ is taken to a value that is more negative than $-VN_{c1}$ for a duration of resistance switching time, then the composite I-V curve 500 switches back from Point D to Point E as indicated by another dashed pointing arrow. Physically, this switching corresponds to a release of charge carriers from the traps.

Figure 6A:
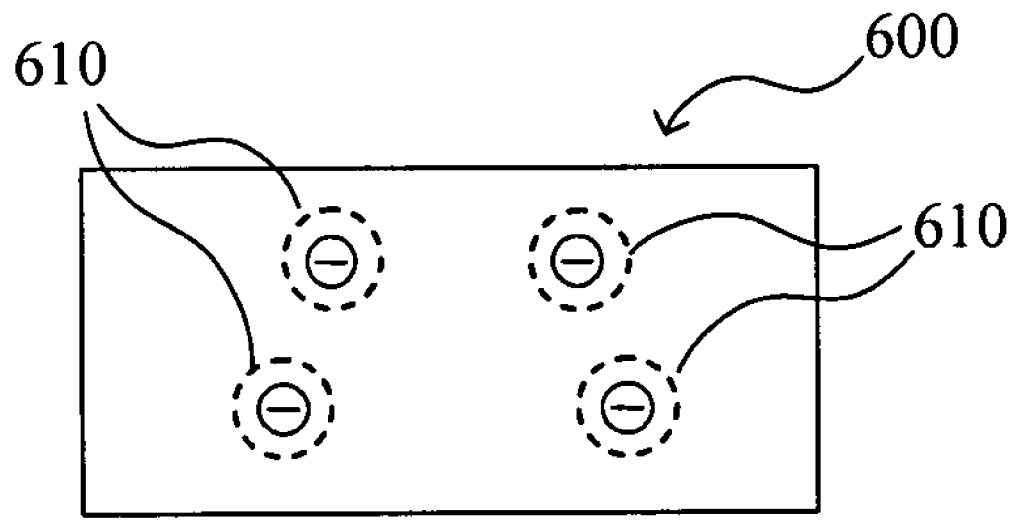
FIG. 6A depicts a section of a resistive memory material with charge traps.
Figure 6B:
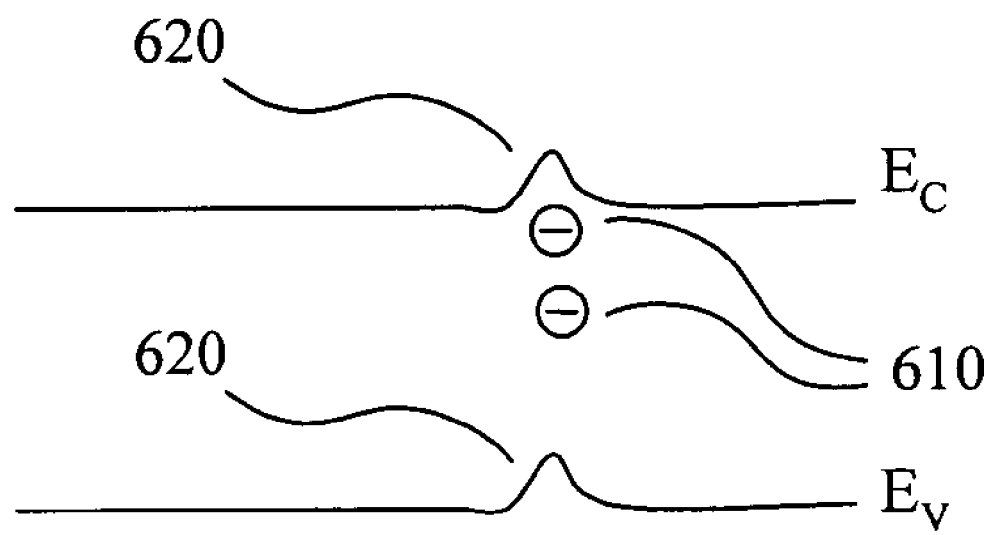
FIG. 6B depicts an energy band diagram of the section of resistive memory material in FIG. 6A.

The underlying mechanism, when the traps are filled with charges, that causes the change of resistance of the trapped charge memory device can be any of the following with, in many cases, analytical modeling expressions available from "Physics of Semiconductor devices," $2^{nd}$ Edition: S. M. Sze, Publisher: John Wiley & Sons, 1981 P. 403, incorporated herein by reference for all purpose, approximating the accompanying J-V characteristics:

The presence of the trapped charge modifies or otherwise alters the conductivity of the bulk trapped charge memory body material. An example is illustrated in FIG. 6A which depicts a section of a resistive memory material 600 with charge traps 610. Each charge trap 610 is shown carrying an amount of negative charge. Here, the charge traps 610 act to reduce the flow of electrons by repelling those electrons traveling nearby. On the other hand, the same charge traps 610 can enhance the flow of holes by attracting those holes traveling nearby. Thus, depending upon its polarity, a trapped charge could either enhance or deplete the concentration of free current carriers in its vicinity. The corresponding energy band diagram is illustrated in FIG. 6B showing a localized elevation 620 of both conduction band $E_C$ and valence band $E_V$.

Figure 7:
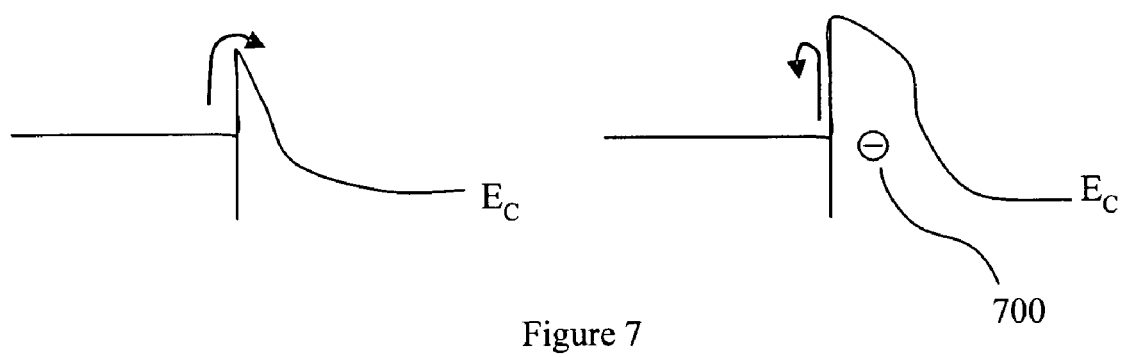
FIG. 7 depicts energy band diagrams of a Schottky barrier without and with a charged trap.

The presence of the trapped charge raises or lowers, depending upon the charge type, the height of the Schottky barrier at the top electrode to trapped charge memory body contact or at the bottom electrode to trapped charge memory body contact. The trapped charge would raise the Schottky barrier for free carriers of like charge polarity by introducing an opposition electric field at the contact. On the other hand, the trapped charge would lower the Schottky barrier for free carriers of the opposite polarity by introducing an enhancement electric field at the contact. Consequently, a higher Schottky barrier acts to increase the resistance of the trapped charge memory device and vice versa. The corresponding energy band diagrams of the Schottky barrier are shown in FIG. 7 wherein the left side has no charged trap but the right side has a charged trap 700 and the free carriers are electrons.

Figure 8:
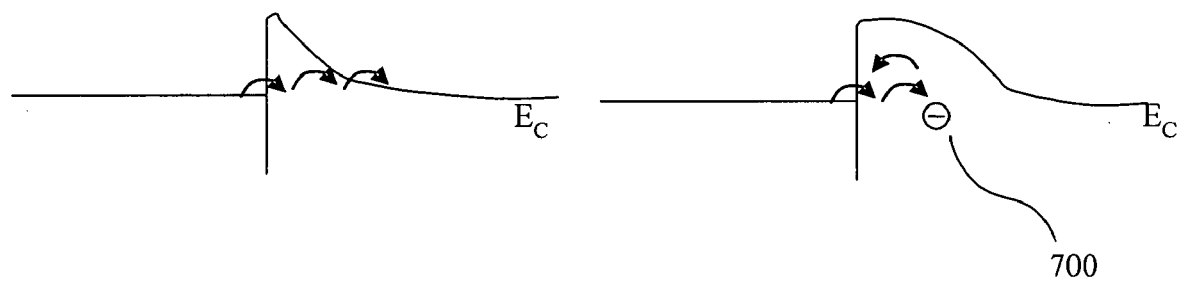
FIG. 8 depicts energy band diagrams of trap to trap conduction without and with trapped charge.

The interface between a metal electrode and a CMO film can have a depletion region, like in a Schottky barrier, and traps at the interface can affect conduction. The mechanism of trap to trap hopping, or "hopping conduction" was presented in "New conduction and reversible memory phenomena in thin insulating films" by J. G. Simmons and R. R. Verderber, Proc. Roy. Soc. A. 301, 1967 PP. 77–102. al 1967, already incorporated herein by reference. Trap to trap hopping, while allowing bipolar conduction, is affected by the presence of trapped charge and are illustrated in the energy band diagrams without (left hand) and with trapped charge (right hand) of FIG. 8.

Figure 9:
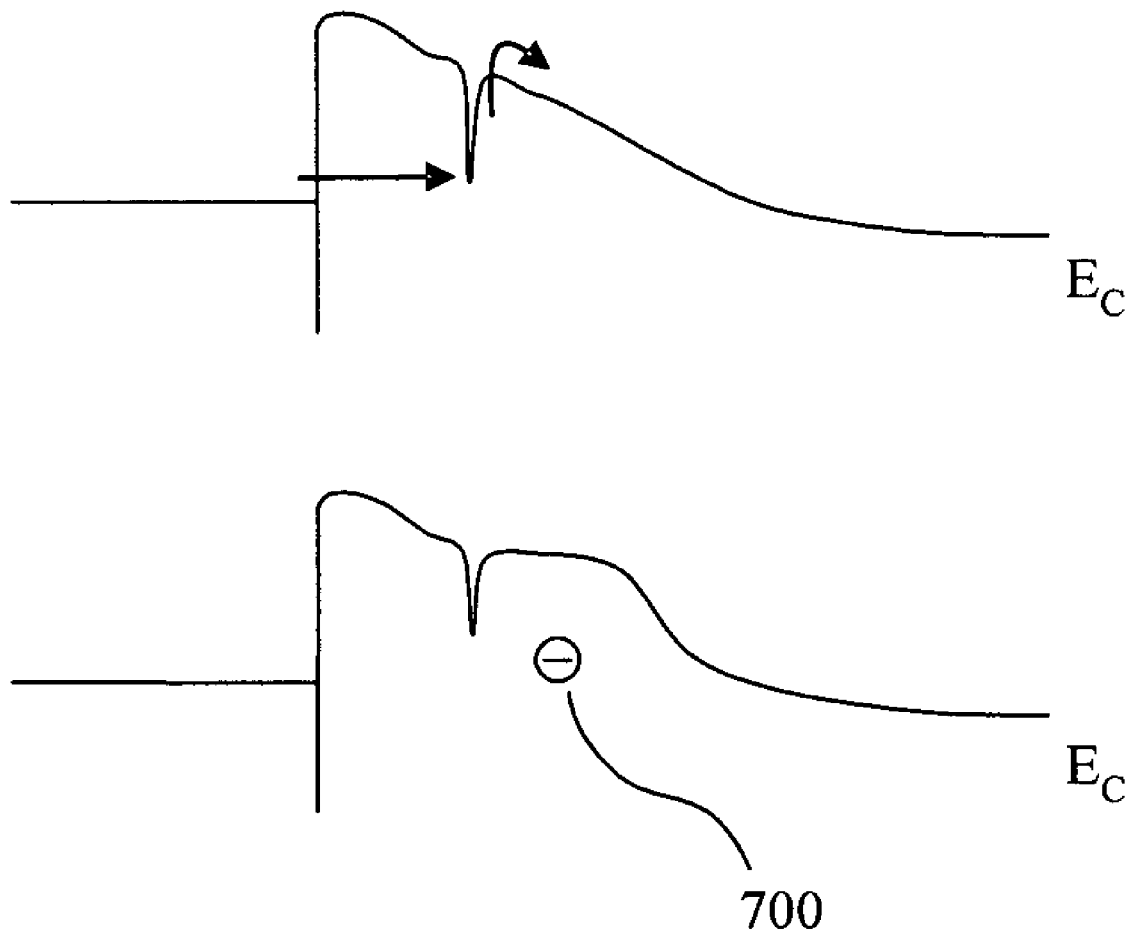
FIG. 9 depicts energy band diagrams of Frenkel-Poole conduction without and with charged trap.

Frenkel-Poole conduction, also see above reference by S. M. Sze 1981, is an electric field assisted thermionic emission from moderately deep traps. Here, charges trapped in other energy levels, while not participating in the emission of current carriers, could affect the resistance as well. Under this mechanism there are two types of traps, the traps that participate in the Frenkel-Poole conduction and the charged traps responsible for the resistance memory effect. The associated trapped charges will affect the resistance by modifying the barrier height in a way similar to mechanism 2 above. The corresponding energy band diagrams of Frenkel-Poole Conduction without (top) and with charged trap (bottom) are illustrated in FIG. 9.

Figure 10:
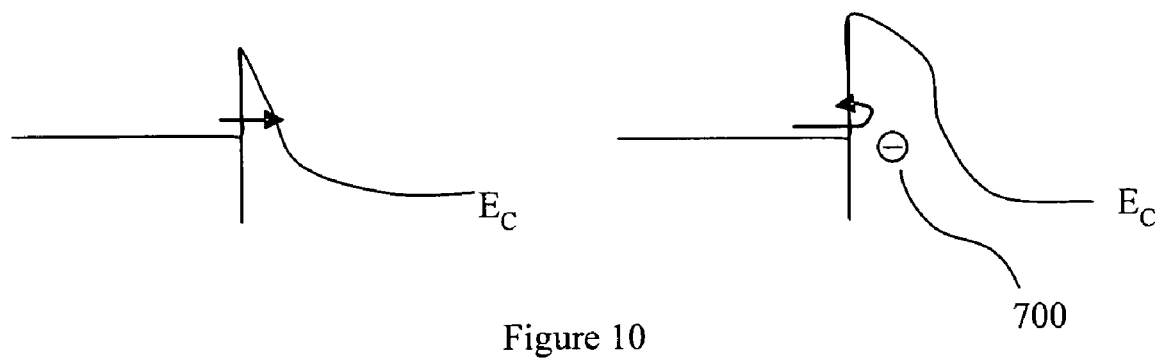
FIG. 10 depicts energy band diagrams of tunneling conduction through a Schottky junction without and with a charged trap.

Tunneling conduction, also see above reference by S. M. Sze 1981, can happen in which current carriers tunnel from the electrode directly to the conduction band (for electrons) or valence band (for holes) in a Schottky-like structure. Here, the trapped charge in the depletion region can affect the resistance in a way similar to mechanism 2 above. The corresponding energy band diagrams of tunneling conduction through a Schottky junction without (left hand) and with a charged trap (right hand) are illustrated in FIG. 10.

Orbital ordering, see the technical papers "Lattice effects in magnetoresistive manganese perovskites," A. J. Millis, NATURE, Vol. 392, Mar. 12, 1998, PP. 147–150 and "X-ray resonant scattering studies of orbital and charge ordering in $Pr_{1-x}Ca_xMnO_3$" M. v. Zimmermann et al, Physical Review B, Vol. 64, 195133, 2001, PP. 1–17 both incorporated herein by reference and for all purposes, is a mechanism in which the electron orbitals in a crystal lattice have a preferred direction, typically in an ordered pattern, such that the resistivity of the crystal lattice will be higher than the case wherein the ordered pattern is disrupted by the addition of charged traps.

For those skilled in the art, while the charges and energy band diagrams from FIG. 6A through FIG. 10 are largely illustrated for electron conduction near the conduction band $E_C$, it should be understood by now that the same mechanisms 1–6 above are equally applicable to hole conduction near the valence band $E_V$ as well.

By now it should be clear that the traps can be charged and discharged in a variety of ways. For example, under a high electric field the current carriers can tunnel from an electrode to the traps or between neighboring traps. For another example, the traps can also be charged by trapping free current carriers with lower energy. Clearly, the concentration of the traps, be it by molecular counts, by weight or by volume, will also determine their net total effect on the resistance $R_d$ of the trapped charge memory device. It should also become clear by now that, with the multitude of the above mechanisms 1-6 each capable of changing the resistance $R_d$ of the trapped charge memory device. The trapped charge memory device can be designed and made to exhibit M distinct voltage switchable pre-determined levels of resistance values $R_1, R_2, \ldots, R_M$ such that $R_j$ switches to $R_{j+1}$ when $V_d$ goes above $+VP_{cj}$ and $R_{j+i}$ switches back to $R_j$ when $V_d$ drops below $-VN_{cj}$. Alternatively, longer voltage pulses can be used instead or in conjunction with higher voltage pulses to reach the desired resistance value.

In addition to functioning as a memory material in an electronic memory system, the trapped charge memory device can function as a simple, generic circuit component capable of easy integration into a variety of electronic systems including the adjustment of precision analog circuits, programmable logic, fuses for selection of redundant areas, over-voltage history detector and dynamically programmable-gain amplifier, etc.

For those skilled in the art, it should become clear by now that, to find a set of specific and quantitative materials, electrical and geometric device parameters for the trapped charge memory device so that it does exhibit the above pre-determined levels of resistance values $R_1, R_2, \ldots, R_M$ switchable at the various pre-determined voltage magnitudes $VP_{cj}$ and $VN_{cj}$ it takes the combination of analytical modeling expressions and a number of systematic, parametric experiments directed at an initial approximate ranging followed by converging these materials, electrical and geometric device parameters into their respective final values. The following, while not being a complete set, lists some analytical modeling expressions from above reference by S. M. Sze 1981:

Schottky emission:

$$J = A^* T^2 \exp\left[\frac{-q(\phi_B - \sqrt{q\xi/4\pi\varepsilon_i})}{kT}\right]$$

with a voltage and temperature dependence of $$\sim T^2 \exp(+a\sqrt{V}/T - q\phi_B/kT) \quad (3A)$$

Frenkel-Poole emission:

$$J \sim \xi \exp\left[\frac{-q(\phi_B - \sqrt{q\xi/\pi\varepsilon_i})}{kT}\right]$$

with a voltage and temperature dependence of $$\sim V \exp(+2a\sqrt{V}/T - q\phi_B/kT) \quad (3B)$$

Tunnel or field emission:

$$J \sim \xi^2 \exp\left[-\frac{4\sqrt{2m^*}(2q\phi_B)^{3/2}}{3qh\xi}\right]$$

with a voltage and temperature dependence of $$\sim V^2 \exp(-b/V) \quad (3C)$$

Ohmic conduction:

$$J \sim \xi \exp(-\Delta E_{ae}/kT)$$

with a voltage and temperature dependence of $$\sim V \exp(-c/T) \quad (3D)$$

Ionic conduction:

$$J \sim \xi/T) \exp(-\Delta E_{ai}/kT)$$

with a voltage and temperature dependence of $$\sim \frac{V}{T} \exp(-d'/T) \qquad (3E)$$

Where:

A*=effective Richardson constant, $\phi_B$=barrier height, $\xi$=electric field, $\epsilon_i$=insulator dynamic permittivity, m*=effective mass, d=insulator thickness, $\Delta E_{ae}$=activation energy of electrons, h=reduced Planck constant, $\Delta E_{ai}$=activation energy of ions, and a ≡ $\sqrt{q/(4\pi\epsilon_i d)}$. V=$\xi$d, J=current density, V=terminal voltage. Positive constants independent of V or T are b, c, and d'.

The following enumerates some specific, although not exhaustive, examples of device parameters of the trapped charge memory device:

- materials parameters—material for each of top electrode, trapped charge memory body and bottom electrode; material, concentration and energy levels of current carrier traps within the trapped charge memory body;
- electrical parameters—body resistivity of the trapped charge memory body, degree of carrier occupancy for each type of carrier trap, barrier height and depth at the top electrode-to-trapped charge memory body contact and at the bottom electrode-to-trapped charge memory body contact; and
- geometric parameters—cross sectional dimensions and thickness for each of top electrode, trapped charge memory body and bottom electrode.

The fabrication of the trapped charge memory device as described, being basically a multi-layered thin film structure with each film typically of a thickness less than 10 μm, includes (1) providing a substrate on which to first form the bottom electrode 210 material, (2) forming or depositing the trapped charge memory body 220 material having current carrier traps, with a variety of means to be presently described, that may or may not already have the finally desired degree of carrier occupancy, on top of the bottom electrode 210, (3) forming or depositing the top electrode 230 material on top of the trapped charge memory body 220 and, under conditions where the current carrier traps of the formed trapped charge memory body do not yet have the finally desired degree of carrier occupancy, (4) conditioning the trapped charge memory device with a variety of means, to be presently described, to impart the current carrier traps with the finally desired degree of carrier occupancy. Alternatively, conditioning of the trapped charge memory body can also take place during the fabrication process, e.g., just before step (3). The benefit of conditioning is that typically it is desirable to have all the individual trapped charge memory device within a memory system at a uniform state of carrier occupancy at the end of the fabrication process. This allows for quicker and therefore cheaper testing of the memory system. For example, it is desirable to have all the trapped charge memory device either at a high resistance state or at a low resistance state as opposed to being at some intermediate state of carrier occupancy.

Some specific fabrication processes for the trapped charge memory device include: Solution based spin on followed by high temperature anneal, pulsed laser deposition (PLD), sputtering, and metalorganic chemical vapor deposition (MOCVD).

The substrate material should be polycrystalline or single crystalline, be conductive, and can itself serve as an electrode already.

The material for the trapped charge memory body is generally conductive metal oxides (CMO) with some of these CMO generally having a crystalline or polycrystalline perovskite structure. Generally, the CMO material includes two or more metals, the metals being selected from the group consisting of transition metals, alkaline earth metals and rare earth metals.

The specific composition can, however, be any of a number of varieties, including the following examples of manganites:

| | |
|---|---|
| PCMO | $Pr_{.7}Ca_{.3}MnO_3$ |
| LCMO | $La_{.7}Ca_{.3}MnO_3$ |
| LSMO | $La_{.7}Sr_{.3}MnO_3$, |

Titanates (e.g., STO:Cr, STO:Fe, STO:Ni), zirconates (e.g., SZO:Cr, $Ca_2Nb_2O_7$:Cr, and $Ta_2O_5$:Cr) and high Tc superconductors (e.g., YBCO). Notice that the elements Cr, Fe or Ni can create traps at deep energy levels in STO and in SZO. In this case, the traps are created intrinsically within the trapped charge memory body material during its fabrication. It is remarked that, $MnO_3$, when combined with the rare earth metals La, Pr or some combination thereof and the alkaline earth metals Ca, Sr or some combination thereof, has been found to produce a particularly effective CMO material. Notice that the trapped charge memory body material employed in this invention is not limited to either the conductive metal oxide or the perovskite crystal lattice structure. Any material approximating the I-V characteristics as described above may be suitable for use as the trapped charge memory body material of this invention. Additionally, the chemical and materials properties of the trapped charge memory body material are selected to meet various target electrical specifications. For one example, the trapped charge memory body material preferably has a resistivity of not greater than about 1 Ohm-cm, exhibits a switchable resistance change of at least about 10×, and has this resistance change triggered by the application of a voltage pulse of not longer than about 100 ns duration and not greater than about 3 Volt in magnitude. For another example, the trapped charge memory body material thickness is dictated by the desired resistive states of the trapped charge memory body material and the write threshold voltage. A trapped charge memory body material with a write threshold voltage of 1.5 volts might be between 1000 Å and 3000 Å in thickness.

The material selection for the electrode layers would ideally be as thin as possible while still preventing metal inter-diffusion and, if necessary, being useful as a seed layer. Typical electrode material commonly used in fabrication includes Pt, Au, Ag and Al. While the electrode layers would only be used as a barrier to prevent metal inter-diffusion, then a thin layer of metal, e.g. TiN, could be used. Any number of electrically conductive materials can be used for a seed layer of the CMO material. For example, the seed layer could be a conductive perovskite, such as $LaNiO_3$ or $SrRuO_3$ on Pt, a conductive metal oxide, such as $IrO_2$ on Ir or $RuO_2$ on Ru, a noble metal such as Pt on TiN. To make fabrication more efficient, the top and bottom electrode layers could use the same conductive layer for the seed layer.

As mentioned before, current carrier traps can be created within the trapped charge memory body and imparted with a finally desired degree of carrier occupancy with a variety of conditioning means. There are several different mechanisms that might create charged traps within a material. For example, STO or SZO can be doped by adding an element that has a different preferred oxidation state (a different charge when ionized) when it replaces an element within the crystal matrix. In SZO, chromium (Cr), with a +3 oxidation state, can replace zirconium (Zr) with a +4 oxidation state. Thereafter, free carriers can either compensate for the charge imbalance by creation of appropriate vacancies (e.g., oxygen vacancies) or by change of the valence on a matrix element. A dopant atom usually substitutes for a matrix element based, at least partly, on the similarity of ionic radii. Thus lanthanum (La) primarily substitutes for strontium (Sr) whereas Cr primarily substitutes for Zr in SZO. In SZO, cation vacancies are rare (i.e., there are few Sr and Zr vacancies) but anion vacancies (i.e., oxygen) are common. Therefore, adding Cr to SZO generates both oxygen vacancies and free holes. However, as the addition of Cr is completely compensated by oxygen vacancies (one vacancy for every 2 Cr atoms) the net result is that the material remains essentially insulating. In contrast, free electrons primarily compensate for La in SZO. Therefore adding La drastically lowers the resistance of SZO. Similarly tantalum (Ta) or niobium (Nb) can substitute for Zr to lower SZO resistivity.

Further, vacancies (either anion or cation) can also act to create charge traps. The charge imbalance caused by a vacancy can be compensated for by the same mechanisms that compensate for the intentional addition of a dopant. Thus, an oxygen vacancy, compensated for by two Cr atoms, provides no free carriers but if there is insufficient Cr atoms for full compensation, these oxygen vacancies lead to free electrons. Some dopants create centers at deep levels within the bandgap. Such dopants create centers where a trapped charge would need a high level of energy to exit that level, effectively creating traps with the deep levels. For example, Cr, Fe or Ni can create traps in STO and SZO. On the contrary, yttrium (Y), La, Nb and Ta could only create centers at shallow levels which would not act as traps. Traps can also be introduced into the trapped charge memory body with high energy radiation or particle beam bombardment, for example UV and X-ray in $SiO_2$. Also neutron transmutation doping has been used to create dopant atoms in silicon. UV light can be used, as with EPROM memories, to discharge all traps, therefore bringing the memory devices to similar Rd levels. Alternatively, all memory devices can be subjected, globally or sequentially, to an electric pulse, whether by passing an electric current or subjecting the memory devices to an electric field. This electrical operation will affect the charges stored in the traps and result in a more uniform charge level in all the traps.

Where one or both of the top electrode-to-trapped charge memory body contact and the bottom electrode-to-trapped charge memory body contact are made non-ohmic with the addition of diodes, the diodes can be (i) a PN junction diode made of amorphous, microcrystalline, polycrystalline or single crystal semiconductor (e.g. Si, Ge, SiGe, GaAs, InP, etc.); (ii) a metal-semiconductor Schottky diode; (iii) a junction field-effect transistor with gate connected to source (or to drain); (iv) a MOSFET with gate either floating, or connected to source or connected to drain; (v) a Zener diode, avalanche diode, or tunnel diode; (vi) a four-layer diode (SCR); (vii) a P-I-N diode made of amorphous, microcrystalline, polycrystalline or single crystal semiconductor. Yet another implementation comprises a metal-insulator-metal (MIM) tunneling device.

As described, a 2-terminal trapped charge memory device with voltage switchable multi-level resistance $R_d$ is disclosed that is based upon a wide variety of material, fabrication and design parameters affecting the electrical terminal behavior of the trapped charge memory device. The invention has been described using exemplary preferred embodiments. However, for those skilled in this field, the preferred embodiments can be easily adapted and modified to suit additional applications without departing from the spirit and scope of this invention. Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

We claim:

1. A trapped charge memory device comprising:
   a top electrode;
   a bottom electrode; and
   a trapped charge memory body sandwiched between and in electrical contact with said top electrode and said bottom electrode, defining both a top electrode to trapped charge memory body contact and a bottom electrode to trapped charge memory body contact;
   wherein said trapped charge memory device contains current carrier traps that influence said trapped charge memory device's voltage switchable resistance $R_d$;
   whereby said influence of $R_d$ is accomplished with energy levels of said current carrier traps, degrees of carrier occupancy or concentration of said current carrier traps, or some combination thereof
   wherein said current carrier traps comprises hole traps.

2. The trapped charge memory device of claim 1 wherein said current carrier traps are characterized by at least one enemy level within a bandgap between a conduction band and a valence band of said trapped charge memory body for trapping current carriers.

3. The trapped charge memory device of claim 1 wherein the energy levels and respective degrees of carrier occupancy of said current carrier traps are selected such that said trapped charge memory device, while under a variable drive voltage of $V_d$ applied between said top electrode and said bottom electrode, exhibiting M voltage switchable levels of resistance values $R_1, R_2, \ldots, R_M$ in the following manner:
   $R_d = R_j$ when $-VN_{cj} <= V_d <= +VP_{cj}$; and
   $R_d$ switches to $R_{j+1}$ when $V_d$ goes above $+VP_{cj}$ followed by $R_d$ switching back to $R_j$ when $V_d$ then drops below $-VN_{cj}$
   where $M >= 2$, $j = (1, 2, \ldots, M-1)$ and each of $VP_{cj}$ and $VN_{cj}$ are positive voltage magnitudes.

4. The trapped charge memory device of claim 3 wherein $VP_{cj}$ is essentially equal to $VN_{cj}$ for at least one value of the index j whereby the corresponding switching of $R_d$ between $R_j$ and $R_{j+1}$ uses a symmetric bipolar drive operation in the voltage domain.

5. The trapped charge memory device of claim 3 wherein the resistance switching time, between members of the resistance values $R_1, R_2, \ldots$ and $R_M$, of said $R_d$ is from about 0.1 ns to about 100 µs.

6. The trapped charge memory device of claim 1 wherein at least one of the top electrode-to-trapped charge memory body contact and the bottom electrode-to-trapped charge memory body contact is made non-ohmic, whereby said $R_d$ exhibits a corresponding degree of nonlinearity.

7. The trapped charge memory device of claim 1 wherein said $R_d$ is a function of the total charge, called trapped charges, carried by trapped current carriers at said current carrier traps.

8. The trapped charge memory device of claim 7 wherein the amount of trapped charges is modifiable by the height and width of a write voltage pulse applied across said top electrode and said bottom electrode.

9. The trapped charge memory device of claim 7 wherein the amount of trapped charges is modifiable by a mechanism of carrier tunneling.

10. The trapped charge memory device of claim 7 wherein the amount of trapped charges is modifiable by a mechanism of free carrier capturing.

11. The trapped charge memory device of claim 1 wherein said $R_1$, is a function of current carrier traps located within two Schottky junctions respectively defined by said top electrode-to-trapped charge memory body contact and said bottom electrode-to-trapped charge memory body contact.

12. The trapped charge memory device of claim 11 wherein said current carrier traps acts, depending upon their charge type, to alter the barrier height of said Schottky junctions thus effecting a corresponding change of $R_d$.

13. The trapped charge memory device of claim 1 wherein said $R_d$ is a function of current carrier traps located near any of said top electrode-to-trapped charge memory body contact or said bottom electrode-to-trapped charge memory body contact that is a Schottky junction.

14. The trapped charge memory device of claim 13 wherein said current carrier traps acts, depending upon their charge type, to alter the barrier height of said Schottky junction thus effecting a corresponding change of $R_d$.

15. The trapped charge memory device of claim 1 wherein most of said current carrier traps are located near said top electrode.

16. The trapped charge memory device of claim 1 wherein most of said current carrier traps are located near said bottom electrode.

17. The trapped charge memory device of claim 1 wherein most of said current carrier traps are located near either said top electrode or said bottom electrode.

18. The trapped charge memory device of claim 1 wherein said $R_d$ is a function of those current carrier traps capable of effecting a trap-hopping type of conduction mechanism.

19. The trapped charge memory device of claim 1 wherein said $R_d$ is a function of those current carrier traps capable of effecting a Frenkel-Poole type of conduction mechanism.

20. The trapped charge memory device of claim 1 wherein said $R_d$ is a function of those current carrier traps capable of disrupting the preferred direction of an ordered pattern of the electron orbitals within a crystal lattice of said trapped charge memory body.

21. The trapped charge memory device of claim 1 wherein said $R_d$ is a function of those current carrier traps capable of affecting an electron tunneling mechanism.

22. The trapped charge memory device of claim 1 wherein said current carrier traps are created within said trapped charge memory body with the addition of a dopant.

23. The trapped charge memory device of claim 22 wherein said trapped charge memory body is made of a crystalline structure and said dopant material is substitutionally fit into said crystalline structure.

24. The trapped charge memory device of claim 22 wherein said trapped charge memory body is made of a crystalline structure and said dopant material is interstitially fit into said crystalline structure.

25. The trapped charge memory device of claim 22 wherein said dopant material is implemented as separate physical clusters within said trapped charge memory body material.

26. The trapped charge memory device of claim 1 wherein said trapped charge memory body comprises a poly-crystalline material and said current carrier traps are created at the grain boundaries of said poly-crystalline material.

27. The trapped charge memory device of claim 1 wherein said trapped charge memory body is a layer of thickness between about 100 Å and about 5000 Å.

28. A method of making a 2-terminal trapped charge memory device with voltage switchable multi-level resistance Rd and having a top electrode, a bottom electrode and a trapped charge memory body sandwiched between and in electrical contact with said top electrode and said bottom electrode defining a top electrode-to-trapped charge memory body contact and a bottom electrode-to-trapped charge memory body contact, said trapped charge memory body containing current carrier traps with at least one of whose energy levels, respective degrees of carrier occupancy and concentration determine said $R_d$, the method comprising:

providing a substrate;

forming a bottom electrode layer atop said substrate;

forming a trapped charge memory body layer atop and in electrical contact with said bottom electrode layer; and forming a top electrode layer atop and in electrical contact with said trapped charge memory body layer wherein said current carrier traps comprises hole traps.

29. The method of making a 2-terminal trapped charge memory device of claim 28 further comprising creating current carrier traps within said trapped charge memory body through a conditioning procedure.

30. The method of making a 2-terminal trapped charge memory device of claim 29 wherein said conditioning procedure imparts said current carrier traps with a desired degree of carrier occupancy.

31. The method of making a 2-terminal trapped charge memory device of claim 30 wherein said conditioning procedure includes high energy radiation, particle beam bombardment or an electrical initialization process.

32. The method of making a 2-terminal trapped charge memory device of claim 31 wherein said high energy radiation includes exposing the trapped charge memory device with X-ray or UV light.

33. The method of making a 2-terminal trapped charge memory device of claim 31 wherein said electrical initialization process includes exposing the trapped charge memory device with an electrical field.

34. The method of making a 2-terminal trapped charge memory device of claim 28 wherein one or both of the top electrode-to-trapped charge memory body contact and the bottom electrode-to-trapped charge memory body contact are made non-ohmic to create a corresponding nonlinearity of $R_d$.

35. The method of making a 2-terminal trapped charge memory device of claim 28 wherein said trapped charge memory body layer is made of a semiconducting material of single-crystalline, poly-crystalline or amorphous structure.

36. The method of making a 2-terminal trapped charge memory device of claim 29 wherein the conditioning procedure is performed after the top electrode is formed.

37. The method of making a 2-terminal trapped charge memory device of claim 36 wherein said conditioning procedure imparts said current carrier traps with a desired degree of carrier occupancy.

38. The method of making a 2-terminal trapped charge memory device of claim 37 wherein said conditioning procedure includes high energy radiation, particle beam bombardment or an electrical initialization process.

39. The method of making a 2-terminal trapped charge memory device of claim 38 wherein said high energy radiation includes exposing the trapped charge memory device with X-ray or UV light.

40. The method of making a 2-terminal trapped charge memory device of claim 38 wherein said electrical initialization process further comprises exposing the trapped charge memory device with an electrical field.

41. The method of making a 2-terminal trapped charge memory device of claim 36 wherein one or both of the top electrode-to-trapped charge memory body contact and the bottom electrode-to-trapped charge memory body contact are made non-ohmic to create a corresponding nonlinearity of $R_d$.

42. The method of making a 2-terminal trapped charge memory device of claim 36 wherein said trapped charge memory body layer is made of a semiconducting material of single-crystalline, poly-crystalline or amorphous structure.

43. The method of making a 2-terminal trapped charge memory device of claim 29 wherein the conditioning procedure is performed after the top electrode is formed and the conditioning procedure imparts said current carrier traps with a desired degree of carrier occupancy.

44. The method of making a 2-terminal trapped charge memory device of claim 43 wherein the charge conditioning procedure includes exposure of the trapped charge memory device to UV light.

45. The method of making a 2-terminal trapped charge memory device of claim 43 wherein the charge conditioning procedure includes exposure of the trapped charge memory device to an electric current.

46. The method of making a 2-terminal trapped charge memory device of claim 43 wherein the charge conditioning procedure includes exposure of the trapped charge memory device to an electric field.

\* \* \* \* \*

UNITED STATES PATENT AND TRADEMARK OFFICE
CERTIFICATE OF CORRECTION

| | | |
|---|---|---|
| PATENT NO. | : 7,038,935 B2 | Page 1 of 1 |
| APPLICATION NO. | : 10/634636 | |
| DATED | : May 2, 2006 | |
| INVENTOR(S) | : Darrell Rinerson et al. | |

It is certified that error appears in the above-identified patent and that said Letters Patent is hereby corrected as shown below:

Kindly Correct the following Errors on part of the USPTO as set forth in (a) below:

On Title Page, Item (75) col. 1

Please DELETE the words " Steve Kuo-Ren Hsia, San Jose, CA (US); "

from the Inventor Name and Residence Information in the INID Code "(75) Inventors:".

Signed and Sealed this

Eleventh Day of July, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,038,935 B2 |
| APPLICATION NO. | : 10/634636 |
| DATED | : May 02, 2006 |
| INVENTOR(S) | : Darrell Rinerson et al. |

It is certified that error appears in the above-identified patent and that said Letters Patent is hereby corrected as shown below:

In Column 12, Line 40, Please DELETE the word "enemy"

and

Kindly REPLACE with the word "energy".

Signed and Sealed this

Fifteenth Day of August, 2006

JON W. DUDAS
*Director of the United States Patent and Trademark Office*